(12) United States Patent
Chen

(10) Patent No.: US 8,760,224 B2
(45) Date of Patent: Jun. 24, 2014

(54) AMPLIFYING CIRCUITS AND CALIBRATION METHODS THEREFOR

(75) Inventor: Kuo-Hsin Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 58 days.

(21) Appl. No.: 13/354,940

(22) Filed: Jan. 20, 2012

(65) Prior Publication Data

US 2013/0187709 A1 Jul. 25, 2013

(51) Int. Cl.
*H03F 1/02* (2006.01)
*H03F 3/45* (2006.01)

(52) U.S. Cl.
CPC .................................. *H03F 3/45973* (2013.01)
USPC ........ 330/9; 330/2; 330/10; 375/238; 332/109

(58) Field of Classification Search
CPC ................................................... H03F 3/45973
USPC ....................................................... 330/9, 51
See application file for complete search history.

(56) References Cited

U.S. PATENT DOCUMENTS

| 6,316,992 | B1 | 11/2001 | Miao et al. |
| 6,724,248 | B2 | 4/2004 | Llewellyn |
| 7,026,866 | B2 | 4/2006 | Llewellyn |
| 7,142,047 | B2 | 11/2006 | Sahandiesfanjani et al. |
| 7,692,488 | B2 * | 4/2010 | Wong et al. ................... 330/251 |
| 2006/0114056 | A1 * | 6/2006 | Sahandiesfanjani et al. ..... 330/9 |

* cited by examiner

*Primary Examiner* — Robert Pascal
*Assistant Examiner* — Khiem Nguyen
(74) *Attorney, Agent, or Firm* — McClure, Qualey & Rodack, LLP

(57) ABSTRACT

An amplifying circuit is provided and includes a signal processor, an edge detector, and a calibration controller. The signal processor transforms amplitude information of a first and second input signals into time domain to provide first and second output signals respectively. The edge detector detects a polarity of a voltage offset from a timing relationship of the first and second output signals. The calibration controller compensates the voltage offset according to a change of the detected polarity.

27 Claims, 16 Drawing Sheets

US 8,760,224 B2

AMPLIFYING CIRCUITS AND CALIBRATION METHODS THEREFOR

BACKGROUND OF THE INVENTION

1. Field of the Invention

The invention relates to an amplifying circuit, and more particularly to a switching amplifying circuit having a calibration operation to reduce output voltage offset.

2. Description of the Related Art

A DC voltage offset is defined by a non-zero DC voltage which is observed at an output terminal of the amplifier when a zero DC voltage is provided to an input terminal of the amplifier. In other words, DC voltage offset occurs in the amplifier. In general, most analog amplifiers, such as linear amplifiers and switching amplifiers, may suffer from DC voltage offset. An amplifier with DC voltage offset within a system may induce disadvantageous influences on some operations of the system. For example, in an audio system, if an amplifier has DC voltage within the audio system, when the audio system has operational state changes like entering or leavings a muted state, the DC voltage offset may induce unpleasant perceptible click/pop noises from a speaker of the audio system, degrading sound quality of the audio system.

Thus, it is desired to provide an amplifying circuit which can reduce DC voltage offset occurring in the amplifying system.

BRIEF SUMMARY OF THE INVENTION

An exemplary embodiment of an amplifying circuit comprises a signal processor, an edge detector, and a calibration controller. The signal processor transforms amplitude information of a first and second input signals into time domain to provide first and second output signals respectively. The edge detector detects a polarity of a voltage offset from a timing relationship of the first and second output signals. The calibration controller compensates the voltage offset according to a change of the detected polarity.

Another exemplary embodiment of an amplifying circuit comprises a processing module, a digital processing chain, a front-end stage, a signal processor, and an edge detector. The processing module generates first and second digital signals. The digital processing chain generates first and second frond-end signals according to the first and second digital signals respectively. The front-end stage generates first and second input signals in a voltage domain according to the first and second frond-end signals respectively. The signal processor transforms amplitude information of the first and second input signals into time domain to provide first and second output signals respectively. The edge detector detects a polarity of a voltage offset from a timing relationship of the first and second output signals. The processing module compensates the voltage offset according to a change of the detected polarity.

An exemplary embodiment of an calibration method for an amplifying circuit comprises steps of transforming amplitude information of a first and second input signals into time domain to generate first and second output signals respectively; detecting a polarity of an voltage offset from a timing relationship of the first and second output signals; and compensating the voltage offset according to a change of the detected polarity.

Another exemplary embodiment of an calibration method for an amplifying circuit comprises of generating first and second digital signals; generating first and second frond-end signals according to the first and second digital signals respectively; generating first and second input signals in a voltage domain according to the first and second frond-end signals respectively; transforming amplitude information of the first and second input signals into time domain to generate first and second output signals respectively; detecting a polarity of an voltage offset from a timing relationship of the first and second output signals; and compensating the voltage offset according to a change of the detected polarity.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
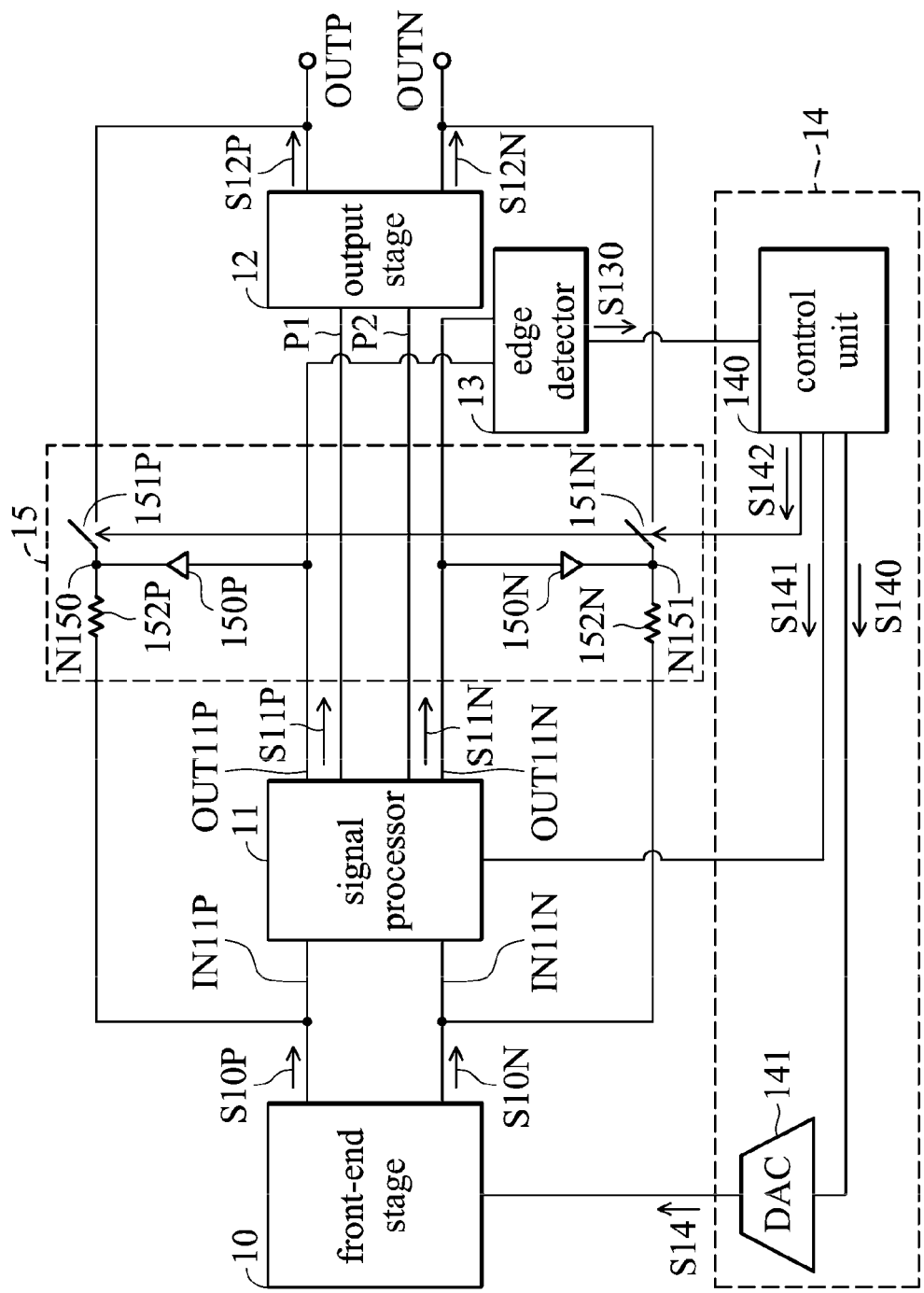
FIG. 1 shows an exemplary embodiment of an amplifying circuit which performs a voltage offset calibration operation via a front-end stage configured in front of before a switching amplifier.

The following description is of the best-contemplated mode of carrying out the invention. This description is made for the purpose of illustrating the general principles of the invention and should not be taken in a limiting sense. The scope of the invention is best determined by reference to the appended claims.

Amplifying circuits are provided. In an exemplary embodiment of a switching amplifying circuit in FIG. 1, an amplifying circuit 1 may perform a voltage offset calibration operation in a calibration mode and comprises a front-end stage 10, a signal processor 11, an output stage 12, an edge detector 13, a calibration controller 14, and a feedback unit 15. In the embodiment, the signal processor 11, the output stage 12, the edge detector 13, the calibration controller 14, and the feedback unit 15 form a switching amplifier. The front-end stage 10 receives a calibration signal S14 from the calibration controller 14 and generates input signals S10P and S10N in a voltage domain. The signal processor 11 receives the input signals S10P and S10N by input terminals IN11P and IN11N and performs a processing operation to the input signals S10P and S10N. According to the processing operation, the signal processor 11 transfers amplitude information of the input signals S10P and S10N into a time domain to provide intermediate signals S11P and S11N at output terminals OUT11P and OUT11N according to the input signals S10P and S10N, respectively. In the embodiment, the intermediate signals S11P and S11N serve as output signals for an edge detection operation of the edge detector 13. Moreover, the signal processor 11 further provides the intermediate signals S11P and S111N the output stage 12. The output stage 12 generates amplified signals S12P and S12N at output terminals OUTP and OUTN of the amplifying circuit 1 according to the intermediate signals S11P and S11N, respectively. In the embodiment, the output stage 12 is implemented by a buffer or an amplifier. Moreover, the calibration controller 14 comprises a control unit 140 and a digital-to-analog converter (DAC) 141 for voltage offset calibration.

Referring to FIG. 1, the feedback unit 15 comprises buffers 150P and 150N, switches 151P and 151N, and resistors 152P and 151N. An input terminal of the buffer 150P is coupled to the output terminal OUT11P of the signal processor 11, and an output terminal thereof is coupled to a node N150. The resistor 152P is coupled between the node N150 and the input terminal IN11P of the signal processor 11. An input terminal of the buffer 150N is coupled to the output terminal OUT11N of the signal processor 11, and an output terminal thereof is coupled to a node N151. The resistor 152N is coupled between the node N151 and the input terminal IN11N of the signal processor 11. Accordingly, the signal processor 11, the buffers 150P and 150N of the feedback unit 15, and the resistors 152P and 152N of the feedback unit 15 form an inner closed loop.

Referring to FIG. 1, the switch 151P is coupled between the output terminal OUTP of the amplifying circuit 1 and the node N150, while the switch 151N is coupled between the output terminal OUTN of the amplifying circuit 1 and the node N151. The switches 151P and 151N are controlled by a switching signal S142 from the control unit 140 of the calibration controller 14. When the switches 151P and 151N are turned on according to the switching signal S142, the signal processor 11, the output stage 12, the turned-on switches 151P and 151N of the feedback unit 15, and the resistors 152P and 152N of the feedback unit 15 form an outer closed loop.

Figure 2A:
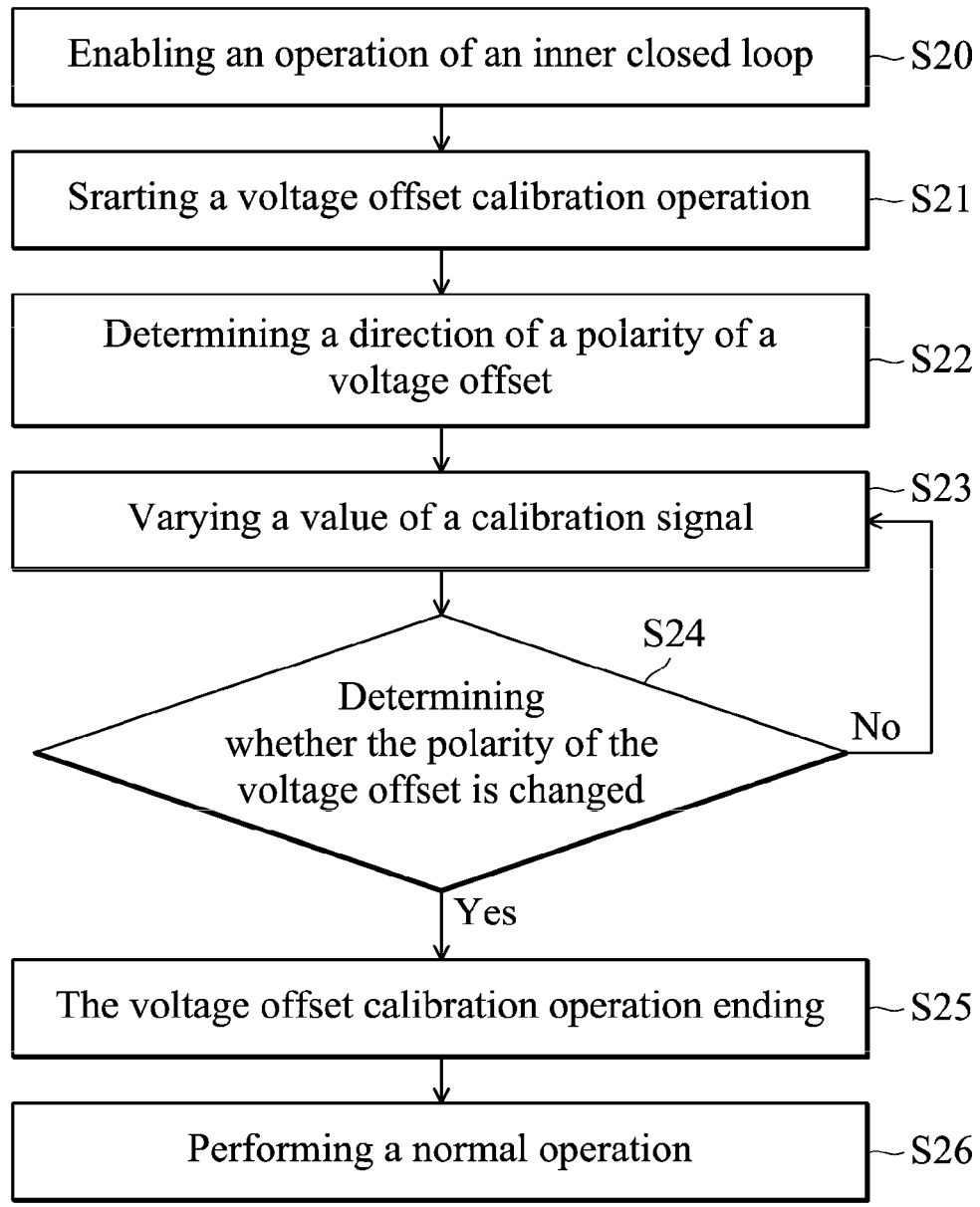
FIG. 2A is a flow chart of an exemplary embodiment of a calibration method for reducing voltage offset.
Figure 2B:
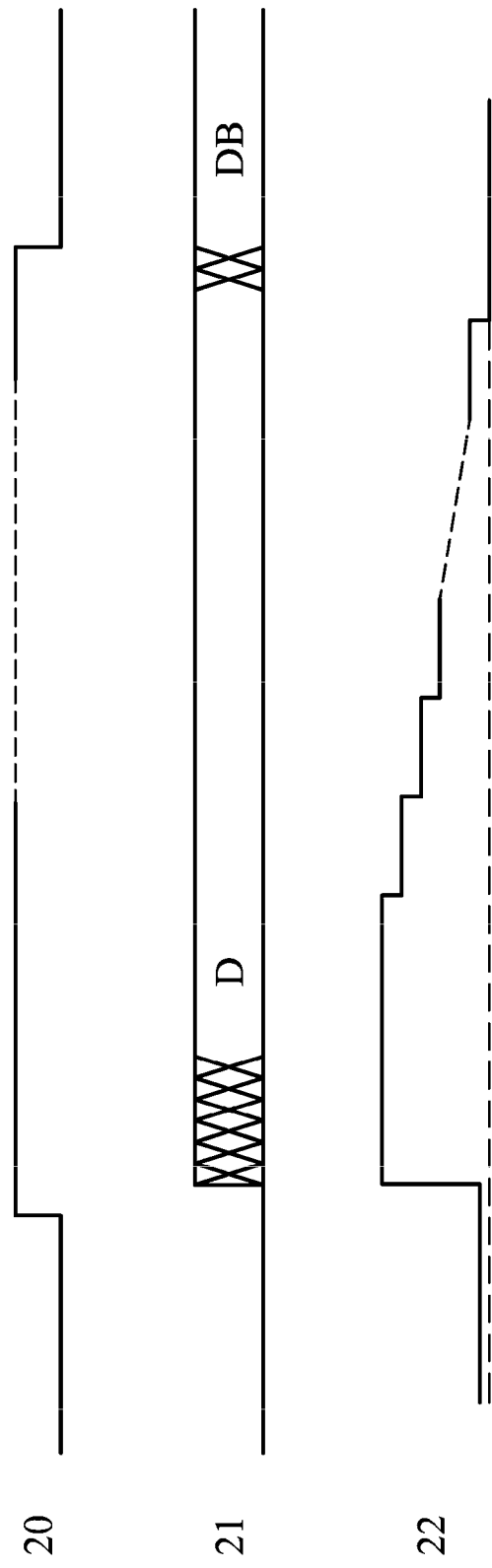
FIG. 2B is a timing chart of the calibration method of FIG. 2A.
Figure 3A:
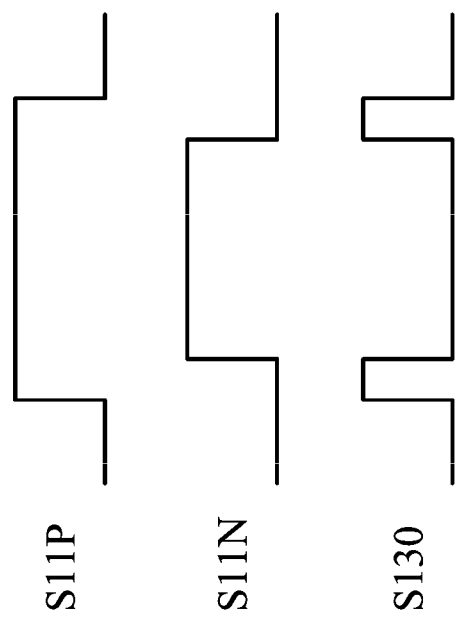
FIGS. 3A and 3B show relationship between intermediate signals and a detection signal of the amplifying circuit in FIG. 1.
Figure 3B:
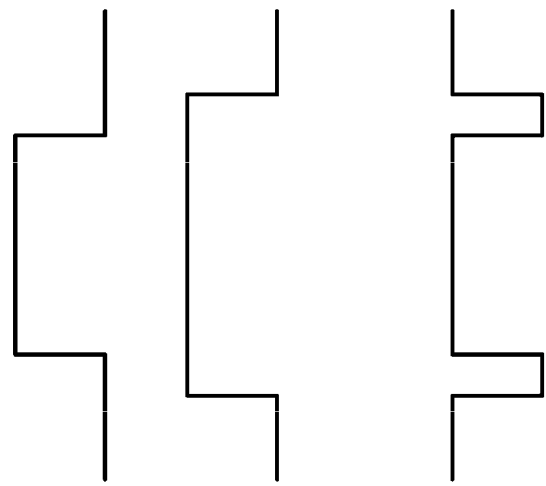

FIG. 2A is a flow chart of a calibration method for reducing voltage offset. FIG. 2B is a timing chart of the calibration method of FIG. 2A. Referring to FIGS. 1-2B. Before the voltage offset calibration operation (the calibration mode) starts, the switches 151P and 151N are turned off according to the switching signal S142, and, thus, the outer closed loop is cut off. Accordingly, the operation of the inner closed loop is enabled (step S20). In FIG. 2B, a reference label 20 represents the operation of the inner closed loop, and a high level of the reference label 20 indicates that the operation of the inner closed loop is enabled. Then, the voltage offset calibration operation starts, that is, the amplifying circuit 1 enters to the calibration mode (step S21). Thus, in the calibration mode, the calibration controller 14 reconfigures the amplifying circuit 1 to operate in the inner closed loop. During the voltage offset calibration operation, the edge detector 13 detects at least one of a rising edge and a falling edge of each of the intermediate signals S11P and S11N to detect the polarity of the voltage offset between the intermediate signals S11P and S11N in the timing relationship and generate a detection signal S130. The control unit 140 receives the detection signal S130 and determines the detected polarity of the voltage offset according to the detection signal S130 (step S22). According to FIG. 3A, when the rising edge of the intermediate signal S11P leads the rising edge of the intermediate signal S11N, the detection signal S130 has positive pulses. According to the detection signal S130 with the positive pulses, the control unit 140 determines that a voltage offset between the intermediate signals S11P and S11N has occurred and that the detected polarity of the voltage offset is positive. According to FIG. 3B, when the rising edge of the intermediate signal S11P lags the rising edge of the intermediate signal S11N, the detection signal S130 has negative pulses. According to the detection signal S130 with the negative pulses, the control unit 140 determines that a voltage offset between the intermediate signals S11P and S11N has occurred and that the detected polarity of the voltage offset is negative.

The control unit 140 generates a digital signal S140 according to the determination result. The DAC 141 receives the digital signal S140 and converts the digital signal S140 to the calibration signal S14 in an analog form. The digital signal S140 indicates the variation of the value of the calibration signal S14. After the control unit 140 determines the detected polarity of the voltage offset, the control unit 140 varies the value of the digital signal S140. Accordingly, the value of the calibration signal S14 is also varied with the varied digital signal S140 (step S23). In the embodiment, the front-end stage 10 then adjusts the input signals S1OP and S1ON according to the varied calibration signal S14 to change the detected polarity of the voltage offset between the intermediate signals S11P and S11 N.

In the embodiment, the calibration controller 14 generates the calibration signal S14 to compensate the voltage offset according to the change of the detected polarity via the frond-end stage 10. When the control unit 140 determines that the voltage offset between the intermediate signals S11P and S11N has a positive polarity, the frond-end stage 10 generates the input signals S10P and S10N between which a voltage offset with a negative polarity has occurred according to the varied calibration signal S14, so that the detected polarity of the voltage offset between the intermediate signals S11P and S11N is changed. In contrary, when the control unit 140 determines that the voltage offset between the intermediate signals S11P and S11N has a negative polarity, the frond-end stage 10 generates the input signals S10P and S10N between which a voltage offset with a positive polarity has occurred according to the varied calibration signal S14, so that the detected polarity of the voltage offset between the intermediate signals S11P and S111N is changed. During the adjustment of the input signals S10P and S10N, the control unit 140 determines whether the detected polarity of the voltage offset is changed according to the detection signal S130 (step S24). Whether the detected polarity of the voltage offset is changed is determined according to the sign of the detected polarity. For example, the detected polarity is changed to positive (+) from negative (−) or to negative from positive. In FIG. 2B, a reference label 21 represents the determination of the detected polarity of the voltage offset, and D and DB represent the determination result. A reference label 22 represents the voltage offset. During the voltage offset calibration operation, the voltage offset is getting smaller. When the control unit 140 determines that the detected polarity is changed, the determination result is changed from D to DB or from DB to D. At this time, the voltage offset is smallest or eliminated. In the step S24, when the control unit 140 determines that the detected polarity of the voltage offset is not changed according to the detection signal S130, the method is back to the step S23. The frond-end stage 10 adjusts the input signals S10P and S10N continuously according to the calibration signal S14. When the control unit 140 determines that the detected polarity of the voltage offset is changed according to the detection signal S130, the voltage offset compensation operation is done, and the calibration controller 14 ends compensating the voltage offset (step S25). After the voltage offset calibration operation, the amplifying circuit 1 is switched to be a normal mode to perform a normal operation (step S26).

In another embodiment, when the control unit 140 determines that the detected polarity of the voltage offset is changed according to the detection signal S130 in the step S24, the calibration controller 14 can still compensate the voltage offset by finely varying the value of the calibration signal S14 until the detected polarity of the offset is changed again. Then, the calibration controller 14 may continuously compensate the voltage offset by finely varying the value of the calibration signal S14. Through finely varying the value of the calibration signal S14 by several times, the offset voltage may be compensated more completely.

Figure 15:
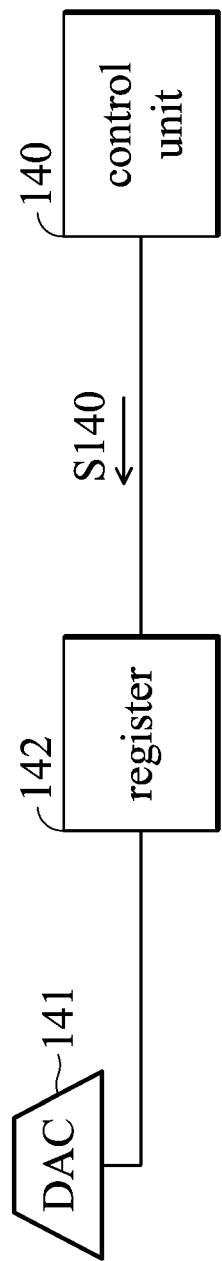
FIG. 15 shows an exemplary embodiment of a calibration controller with a register.

In the embodiment, before the step S26, the value of the digital signal S140 obtained during the voltage offset calibration operation may be stored in a register 142 in the calibration controller 14, shown in FIG. 15. Thus, when the amplifying circuit 1 is turned on or activated again, the above edge detection process is not performed again. The value of the digital signal S140 stored in the register 142 is used to control the DAC 141 to vary the value of the calibration signal S14.

In the embodiment, during the voltage offset calibration operation, the control unit 140 generates a control signal S141. The outer the signal processor 11 stops providing the intermediate signals S11P and S11N to the output stage 12 according to the control signal S141, thereby preventing back-end devices which are configured at back of the output stage 12 from irregular operations.

In the embodiment, the front-end stage 10 is a gain stage. For example, the front-end stage 10 comprises at least one of an analog buffer and a variable gain amplifier. When the front-end stage 10 comprises a variable gain amplifier, the variable gain amplifier receives the calibration signal S14. A transconductance parameter of the variable gain amplifier is adjusted according to the varied calibration signal S14. According to the adjustment, there is a voltage offset between the input signals S10P and S10N, and the polarity of the voltage offset between the input signals S10P and S10N is reverse to the detected polarity of the voltage offset between the intermediate signals S11P and S11N which is determined by the control unit 140.

Figure 4:
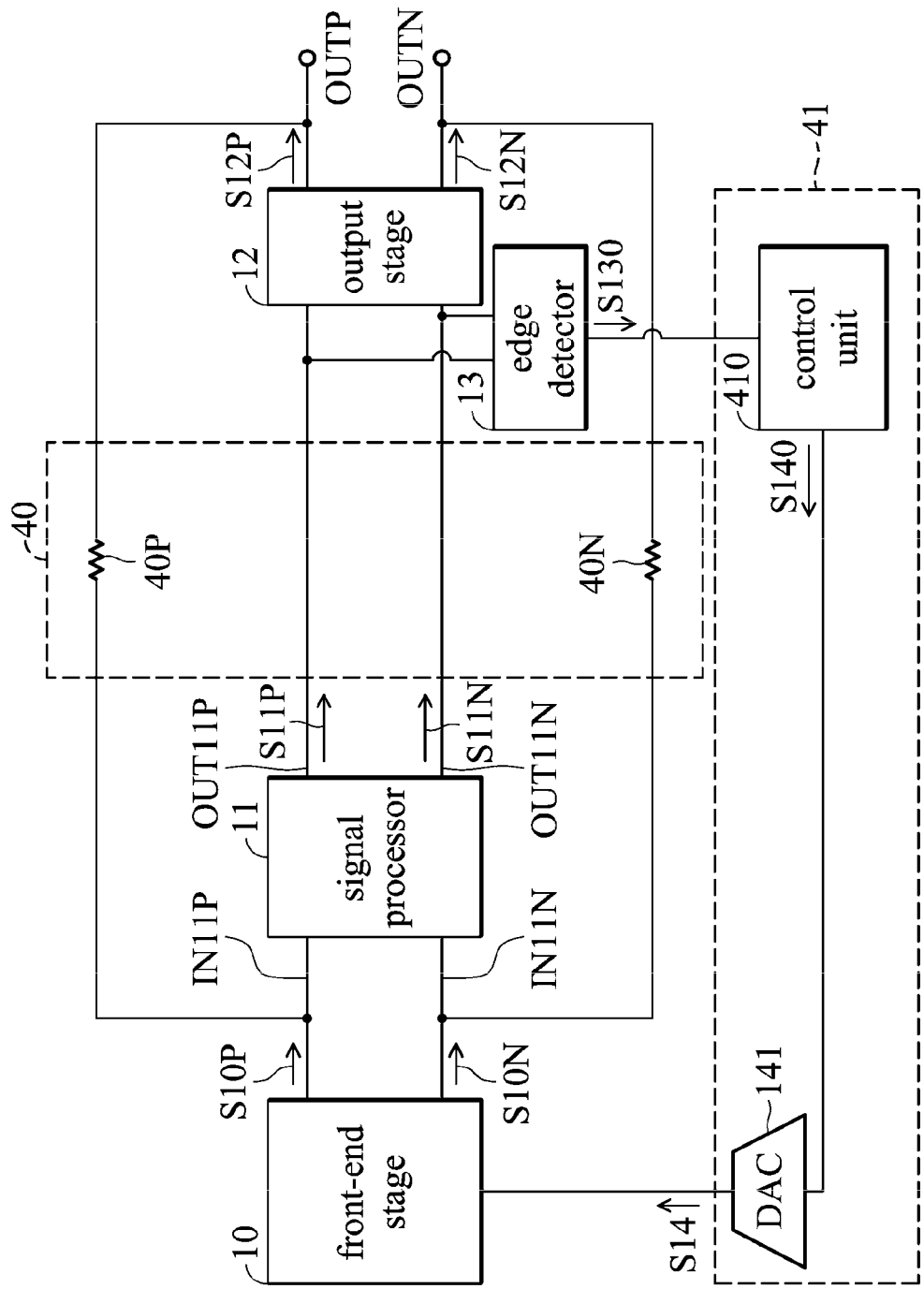
FIG. 4 shows another exemplary embodiment of an amplifying circuit which performs a voltage offset calibration operation via a front-end stage before a switching amplifier.

In some embodiments, there is no inner closed loop. Referring to FIGS. 1 and 4, the same reference label represents the same element. An amplifying circuit 4 comprises a feedback unit 40 which replacing the feedback unit 15 in FIG. 1. The feedback unit 40 comprises resistors 40P and 40N. The resistor 40P is coupled between the output terminal OUTP of the amplifying circuit 4 and the input terminal IN11P of the signal processor 11, while the resistor 40N is coupled between the output terminal OUTN of the amplifying circuit 4 and the input terminal IN11N of the signal processor 11. Accordingly, there is no inner closed loop formed by the signal processor 11 and the feedback unit 40. In this case, both of the output stage 12 and the edge detector 13 are coupled to the output terminals OUT11P and OUT11N of the signal processor 11 to receive the intermediate signals S11P and S11N. Accordingly, the signal processor 11, the output stage 12, and the resistors 40P and 40N of the feedback unit 40 form an outer closed loop. Moreover, the amplifying circuit 4 further comprises a calibration controller 41 replacing the calibration controller 14 of FIG. 1. The calibration controller 41 comprises a control unit 410 replacing the control unit 140 of FIG. 1 and further comprises the DAC 141 of FIG. 1. The difference between the control units 140 and 410 of FIGS. 1 and 4 is that the control unit 410 only generates the digital signal S140 without the control signal S141 and the switching signal S142. Referring to FIG. 4, since the feedback unit 40 does not comprise the switches S151P and 151N of FIG. 1, the control unit 410 may not generate the switching signal S142, and the outer closed loop is not cut off by the control unit 410 during the voltage offset calibration operation (the calibration mode). Moreover, since there is no inner closed loop for voltage offset calibration and the voltage offset calibration operation is performed through the outer closed loop, the signal processor 11 has to provide the intermediate signals S11P and S111N to the output stage 12. Thus, the control unit 410 may not generate the control signal S141 which is configured to control the signal processor 11 to stop providing the intermediate signals S11P and S11N to the output stage 12.

Figure 5:
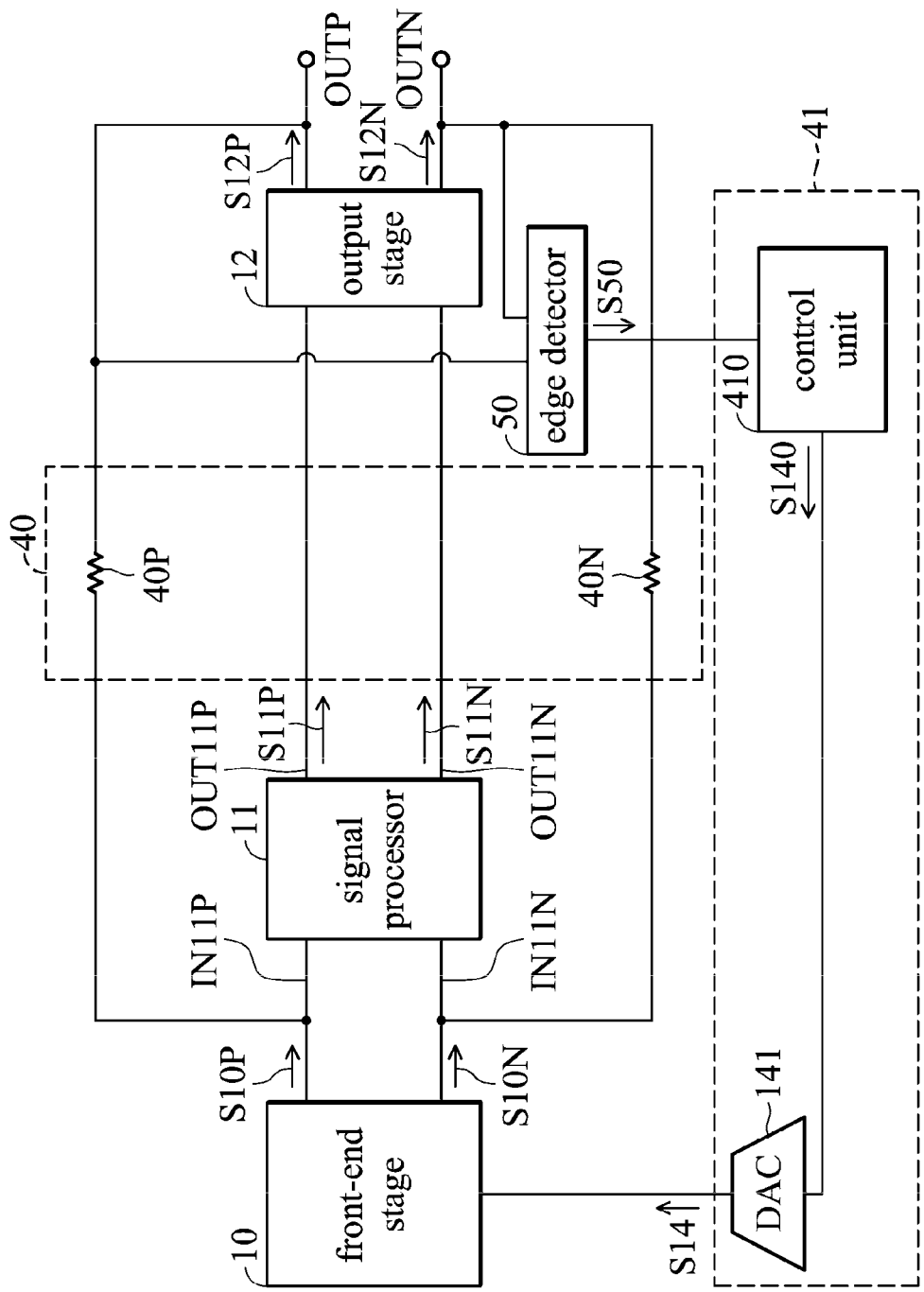
FIG. 5 shows further another exemplary embodiment of an amplifying circuit which performs a voltage offset calibration operation via a front-end stage before a switching amplifier.

In some other embodiments, as shown in FIG. 5, the amplified signals S12P and S12N serve as output signals for the edge detection operation of the edge detector 13. Referring to FIGS. 4 and 5, the same reference label represents the same element. An amplifying circuit 5 comprises an edge detector 50 which replaces the edge detector 13 in FIG. 4. The edge detector 50 is configured to detect at least one of a rising edge and a falling edge of each of the amplified signals S12P and S12N to detect the polarity of the voltage offset between the intermediate signals S11P and S11N in the time relationship and generate a detection signal S50 according to the detection result related to the amplified signals S12P and S12N. That is, the edge detector 50 derives the time relationship of the amplified signals S12P and S12N which are generated after the output stage 12 to generate the detection signal S50. The calibration controller 41 receives the detection signal S50 for the voltage offset calibration.

Figure 6:
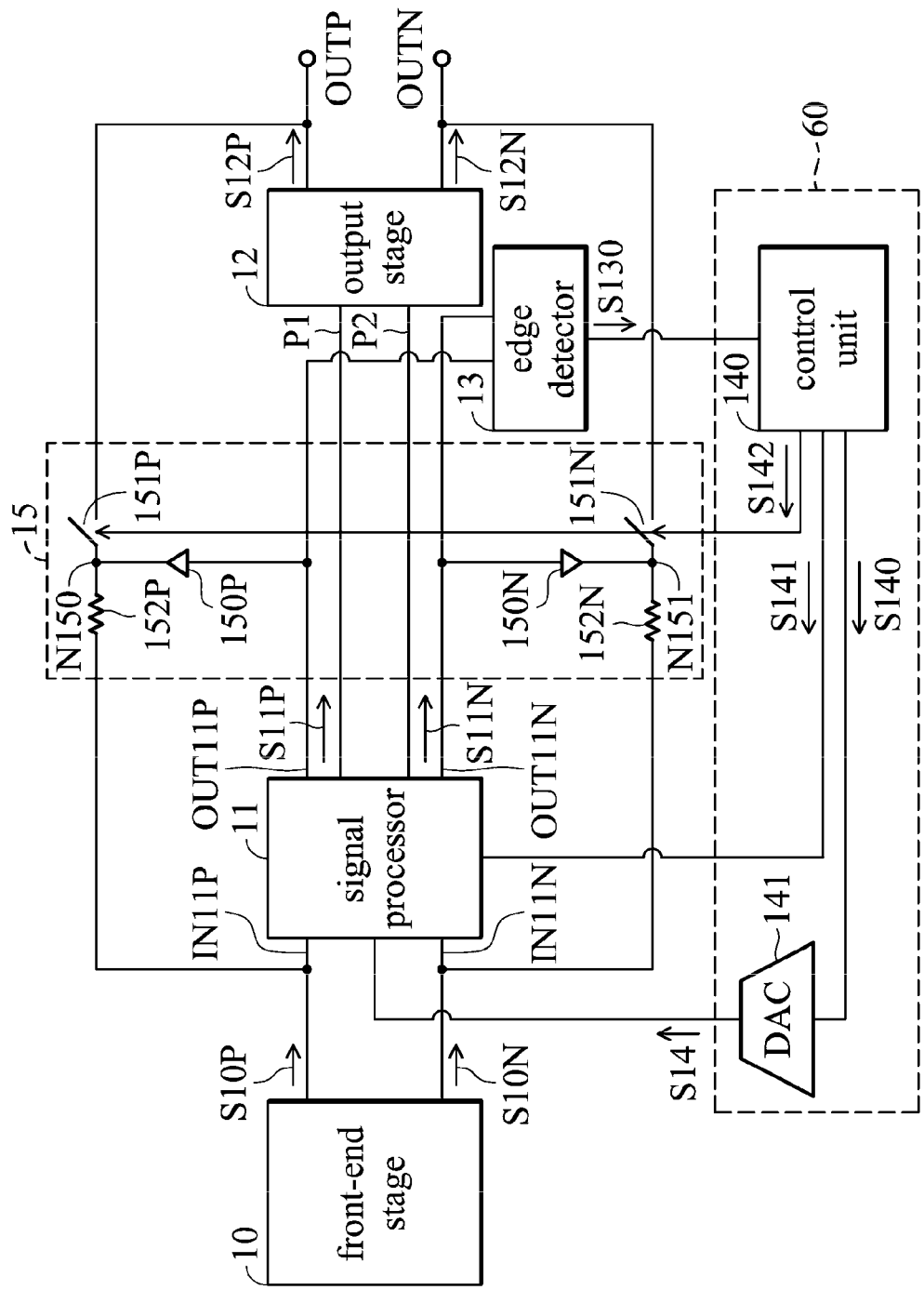
FIG. 6 shows an exemplary embodiment of an amplifying circuit which performs a voltage offset calibration operation via a signal processor within a switching amplifier.

FIG. 6 shows another exemplary embodiment of an amplifying circuit. Referring to FIGS. 1 and 6, the same element is represented by the same reference label. As shown in FIG. 6, an amplifying circuit 6 comprises a calibration controller 60 replacing the calibration controller 14 of FIG. 1. The difference between the calibration controllers 14 and 60 in FIGS. 1 and 6 is that the calibration signal S14 generated by the DAC 141 is provided to the signal processor 11 not to the frond-end stage 10. As the above description, when the calibration controller 14 determines that the voltage offset between the intermediate signals S11P and S11N has occurred according to the detection signal S130 from the edge detector 13, the calibration controller 14 varies the value of the calibration signal S14. The signal processor 11 receives the calibration signal S14 and then adjusts the intermediate signals S11P and S11N according to the varied calibration signal S14 to change the detected polarity of the voltage offset between the intermediate signals S11P and S11N. In the embodiment, the calibration controller 14 generates the calibration signal S14 to compensate the voltage offset to change the detected polarity via the signal processor 11. When the calibration controller 14 determines that the voltage offset between the intermediate signals S11P and S11N has a positive polarity, the signal processor 11 adjusts the intermediate signals S11P and S11N according to the varied calibration signal S14, so that the detected polarity of the voltage offset between the intermediate signals S11P and S11N is changed to negative. In contrary, when the control unit 140 determines that the voltage offset between the intermediate signals S11P and S11N has a negative polarity, the signal processor 11 adjusts the intermediate signals S11P and S11N according to the varied calibration signal S14, so that the detected polarity of the voltage offset between the intermediate signals S11P and S11N is changed to a positive.

Figure 7:
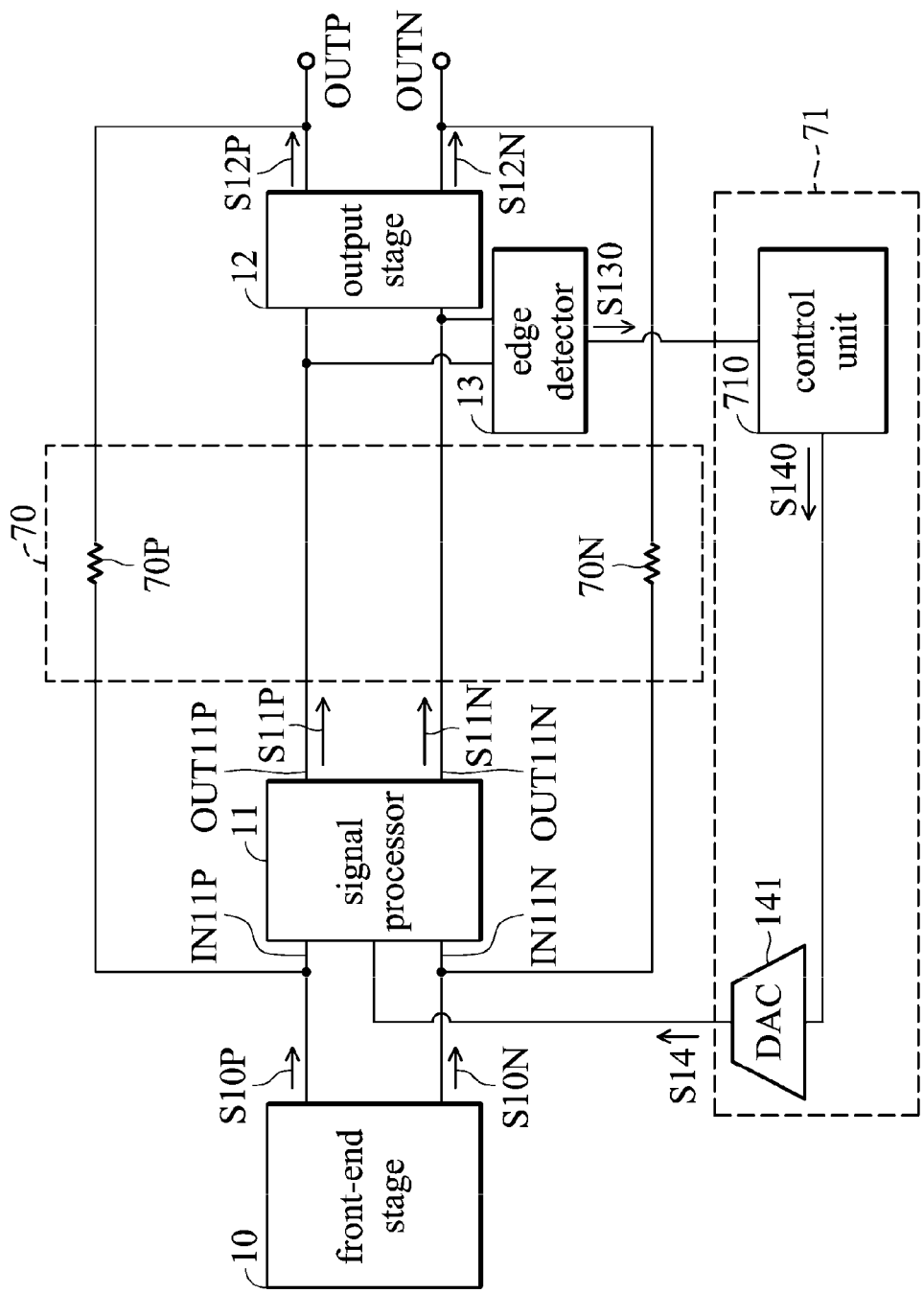
FIG. 7 shows another exemplary embodiment of an amplifying circuit which performs a voltage offset calibration operation via a signal processor within a switching amplifier.

In some embodiments, there is no inner closed loop. Referring to FIGS. 6 and 7, the same reference label represents the same element. An amplifying circuit 7 comprises a feedback unit 70 which replaces the feedback unit 15 in FIG. 6. The feedback unit 70 comprises resistors 70P and 70N. The resistor 70P is coupled between the output terminal OUTP of the amplifying circuit 7 and the input terminal IN11P of the signal processor 11, while the resistor 40N is coupled between the output terminal OUTN of the amplifying circuit 7 and the input terminal IN11N of the signal processor 11. Accordingly, there is no inner closed loop formed by the signal processor 11 and the feedback unit 70. In this case, the output stage 12 and the edge detector 13 are coupled to the output terminals OUT11P and OUT11N of the signal processor 11 to receive the intermediate signals S11P and S11N. The signal processor 11, the output stage 12, and the resistors 70P and 70N of the feedback unit 70 form an outer closed loop. Moreover, the amplifying circuit 7 further comprises a calibration controller 71 replacing the calibration controller 60 of FIG. 6. The calibration controller 71 comprises a control unit 710 replacing the control unit 140 of FIG. 6 and further comprises the DAC 141 of FIG. 6. The difference between the control units 140 and 710 of FIGS. 6 and 7 is that the control unit 710 only generates the digital signal S140 without the control signal S141 and the switching signal S142. Referring to FIG. 7, since the feedback unit 70 does not comprise the switches S151P and 151N of FIG. 6, the control unit 710 may not generate the switching signal S142, and the outer closed loop is not cut off by the control unit 710 during the voltage offset calibration operation (in the calibration mode). Moreover, since there is no inner closed loop for voltage offset calibration and the voltage offset calibration operation is performed through the outer closed loop, the signal processor 11 has to transmit the intermediate signals S11P and S11N to the output stage 12. Thus, the control unit 410 may not generate the control signal S141 which is configured to control the signal processor 11 to stop providing the intermediate signals S11P and S11N to the output stage 12.

Figure 8:
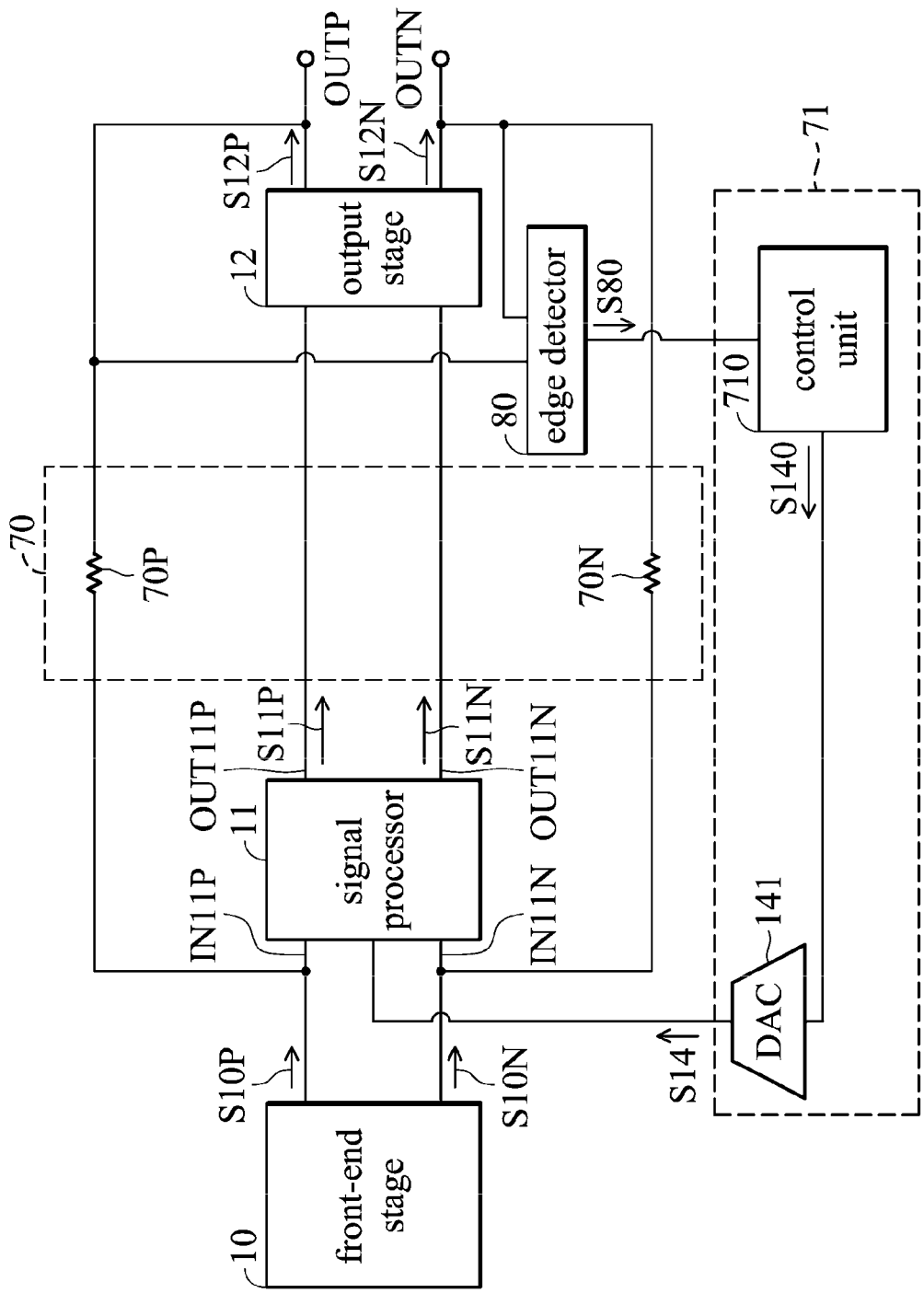
FIG. 8 shows further another exemplary embodiment of an amplifying circuit which performs a voltage offset calibration operation via a signal processor within a switching amplifier.

In some other embodiments, as shown in FIG. 8, the amplified signals S12P and S12N serve as output signals for the edge detection operation of the edge detector 13. Referring to FIGS. 7 and 8, the same reference label represents the same element. An amplifying circuit 8 comprises an edge detector 80 which replaces from the edge detector 13 in FIG. 7. The edge detector 80 is configured to detect at least one of a rising edge and a falling edge of each of the amplified signals S12P and S12N to detect the polarity of the voltage offset between the intermediate signals S11P and S11N in the time relationship and generate the detection signal S80 according to the detection result related to the amplified signals S12P and S12N. That is, the edge detector 80 derives the time relationship of the amplified signals S12P and S12N which are generated after the output stage 12 to generate the detection signal S80. The calibration controller 71 receives the detection signal S80 for the voltage offset calibration.

Figure 9:
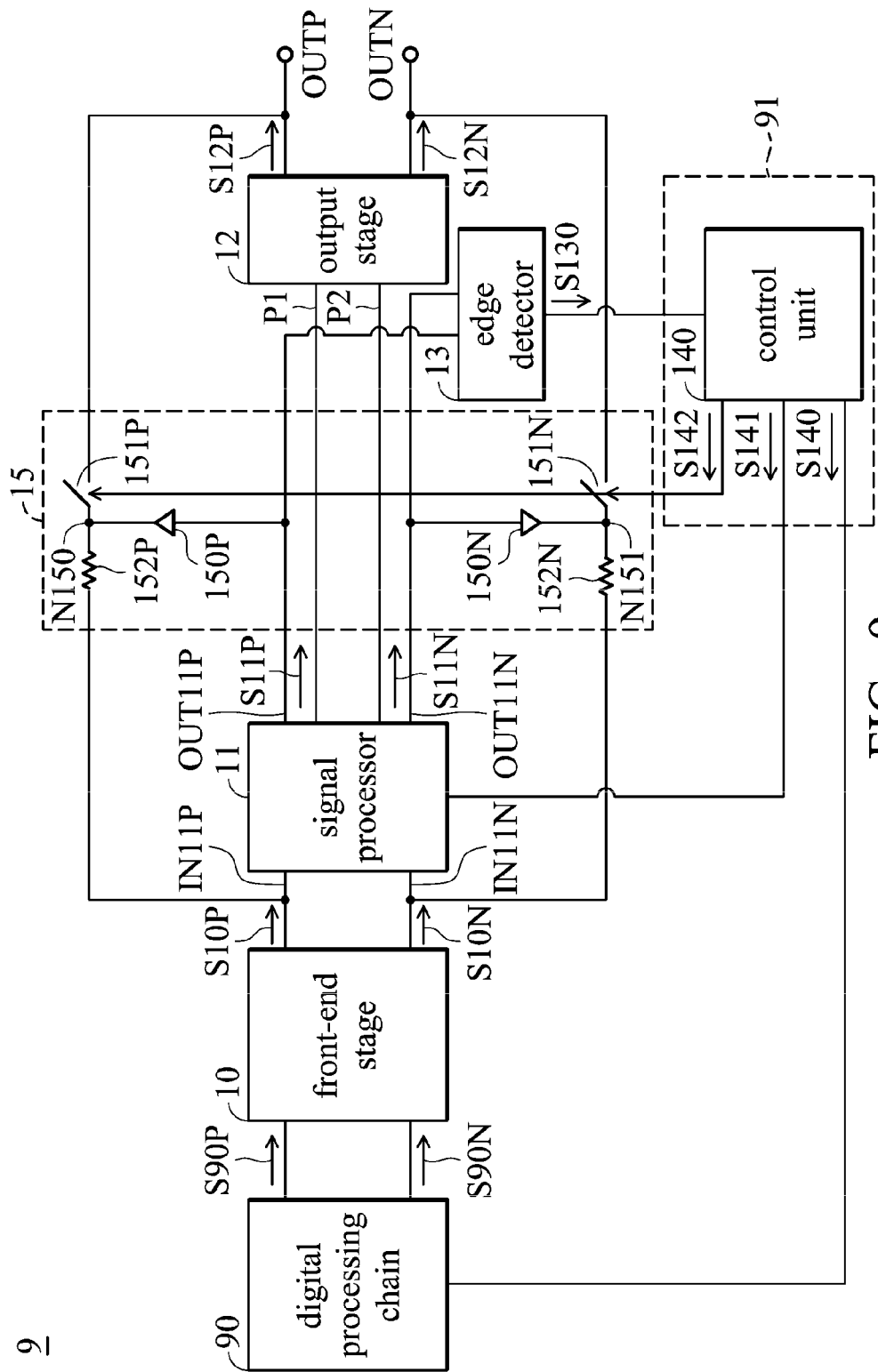
FIG. 9 shows an exemplary embodiment of an amplifying circuit which performs a voltage offset calibration operation via a digital processing chain before a switching amplifier.

FIG. 9 shows another exemplary embodiment of an amplifying circuit. Referring to FIGS. 1 and 9, the same element is represented by the same reference label. The different between the embodiments of FIGS. 1 and 9 is that, in FIG. 9, an amplifying circuit 9 further comprises a digital processing chain 90. Moreover, the amplifying circuit 9 comprises a calibration controller 91 replacing the calibration controller 14 of FIG. 1. Since the digital processing chain 90 processes digital signals, the calibration controller 71 does not require a DAC to convert the digital signal S140 to be in an analog form. Thus, in the embodiment of FIG. 9, the calibration controller 91 does not comprise the DAC 141 of FIG. 1. In the case, the digital signal S140 from the control unit 140 serves as a calibration signal, and the digital processing chain 90 receives the calibration signal. The digital processing chain 90 generates frond-end signals S90P and S90N to the frond-end stage 10. The front-end stage 10 receives the frond-end signals S90P and S90N and generates the input signals S10P and S10N according to the frond-end signals S90P and S90N respectively. When the calibration controller 91 determines that the voltage offset between the intermediate signals S11P and S11N has occurred according to the detection signal S130 from the edge detector 13, the calibration controller 91 varies the value of the calibration signal S140. The digital processing chain 90 receives the calibration signal S140 and then adjusts the frond-end signals S90P and S90N according to the varied calibration signal S140 to change the detected polarity of the voltage offset between the intermediate signals S11P and S11N. In the embodiment, the calibration controller 14 generates the calibration signal S14 to compensate the voltage offset according to the change of the detected polarity via the signal processor 11. When the calibration controller 91 determines that the voltage offset between the intermediate signals S11P and S11N has a positive polarity, the digital processing chain 90 generates the frond-end signals S90P and S90N between which a voltage offset with a negative polarity has occurred according to the varied calibration signal S140, so that the detected polarity of the voltage offset between the intermediate signals S11P and S11N is changed. When the control unit 140 determines that the voltage offset between the intermediate signals S11P and S11N has a negative polarity, the digital processing chain 90 generates the frond-end signals S90P and S90N between which a voltage offset with a positive polarity has occurred according to the varied calibration signal S140, so that the detected polarity of the voltage offset between the intermediate signals S11P and S11N is changed.

Figure 10:
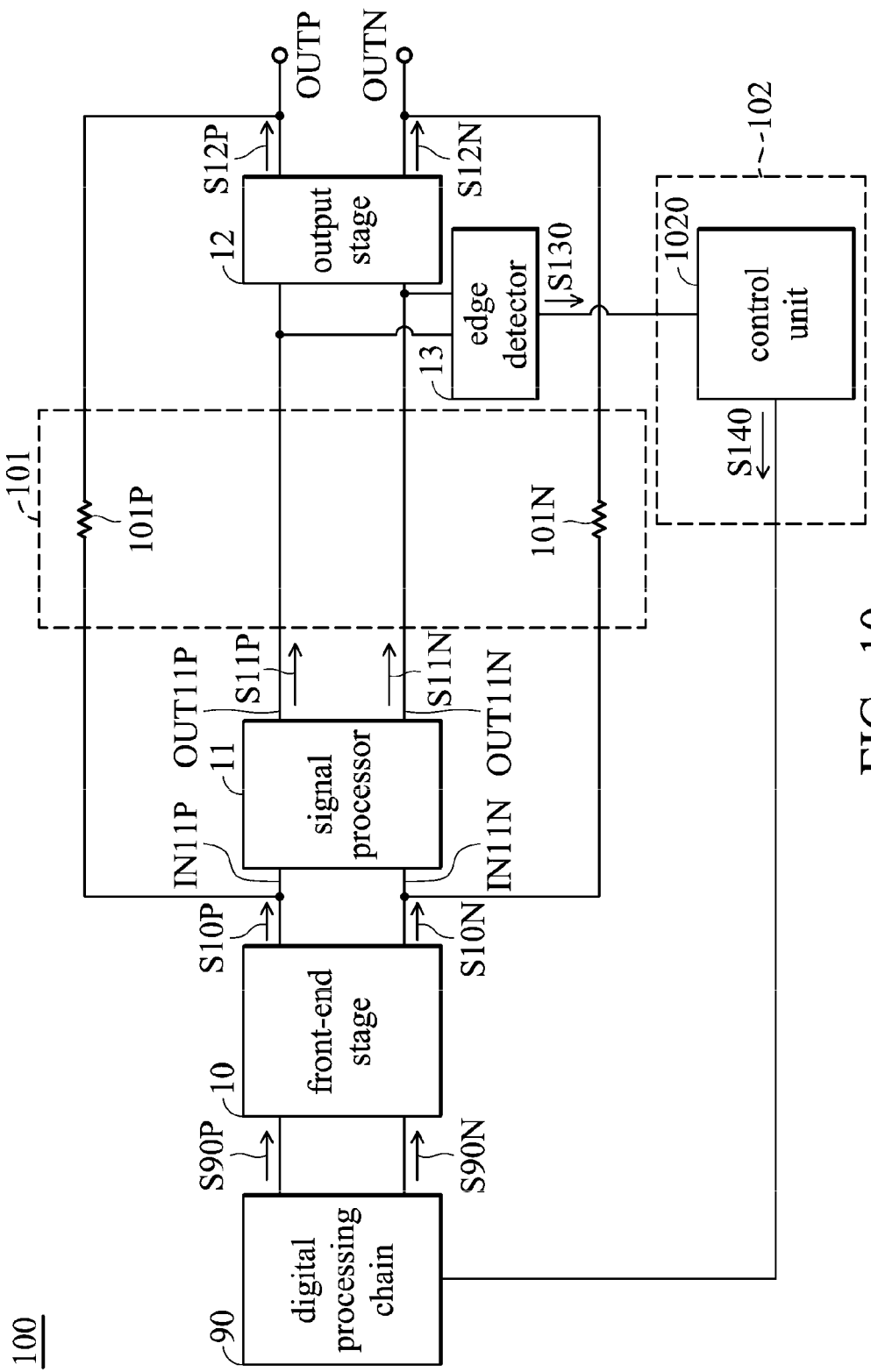
FIG. 10 shows another exemplary embodiment of an amplifying circuit which performs a voltage offset calibration operation via a digital processing chain before a switching amplifier.

In some embodiments, there is no inner closed loop. Referring to FIGS. 9 and 10, the same reference label represents the same element. An amplifying circuit 100 comprises a feedback unit 101 which replacing the feedback unit 15 in FIG. 9. The feedback unit 101 comprises resistors 101P and 101N. The resistor 101P is coupled between the output terminal OUTP of the amplifying circuit 100 and the input terminal IN11P of the signal processor 11, while the resistor 101N is coupled between the output terminal OUTN of the amplifying circuit 100 and the input terminal IN11N of the signal processor 11. Accordingly, there is no inner closed loop formed by the signal processor 11 and the feedback unit 101. In this case, the output stage 12 and the edge detector 13 are coupled to the output terminals OUT11P and OUT11N of the signal processor 11 to receive the intermediate signals S11P and S11N. The signal processor 11, the output stage 12, and the resistors 101P and 101N of the feedback unit 101 form an outer closed loop. Moreover, the amplifying circuit 100 further comprises a calibration controller 102 replacing the calibration controller 91 of FIG. 9. The calibration controller 102 comprises a control unit 1020 replacing the control unit 140 of FIG. 9. The difference between the control units 140 and 1020 of FIGS. 9 and 10 is that the control unit 1020 only generates the digital signal S140 without the control signal S141 and the switching signal S142. Referring to FIG. 10, since the feedback unit 101 does not comprise the switches S151P and 151N of FIG. 9, the control unit 1020 may not generate the switching signal S142, and the outer closed loop is not cut off by the control unit 1020 during the voltage offset calibration operation (in the calibration mode). Moreover, since there is no inner closed loop for voltage offset calibration and the voltage offset calibration operation is performed through the outer closed loop, the signal processor 11 has to provide the intermediate signals S11P and S11N to the output stage 12. Thus, the control unit 410 may not generate the control signal S141 which is configured to control the signal processor 11 to stop providing the intermediate signals S11P and S11N to the output stage 12.

Figure 11:
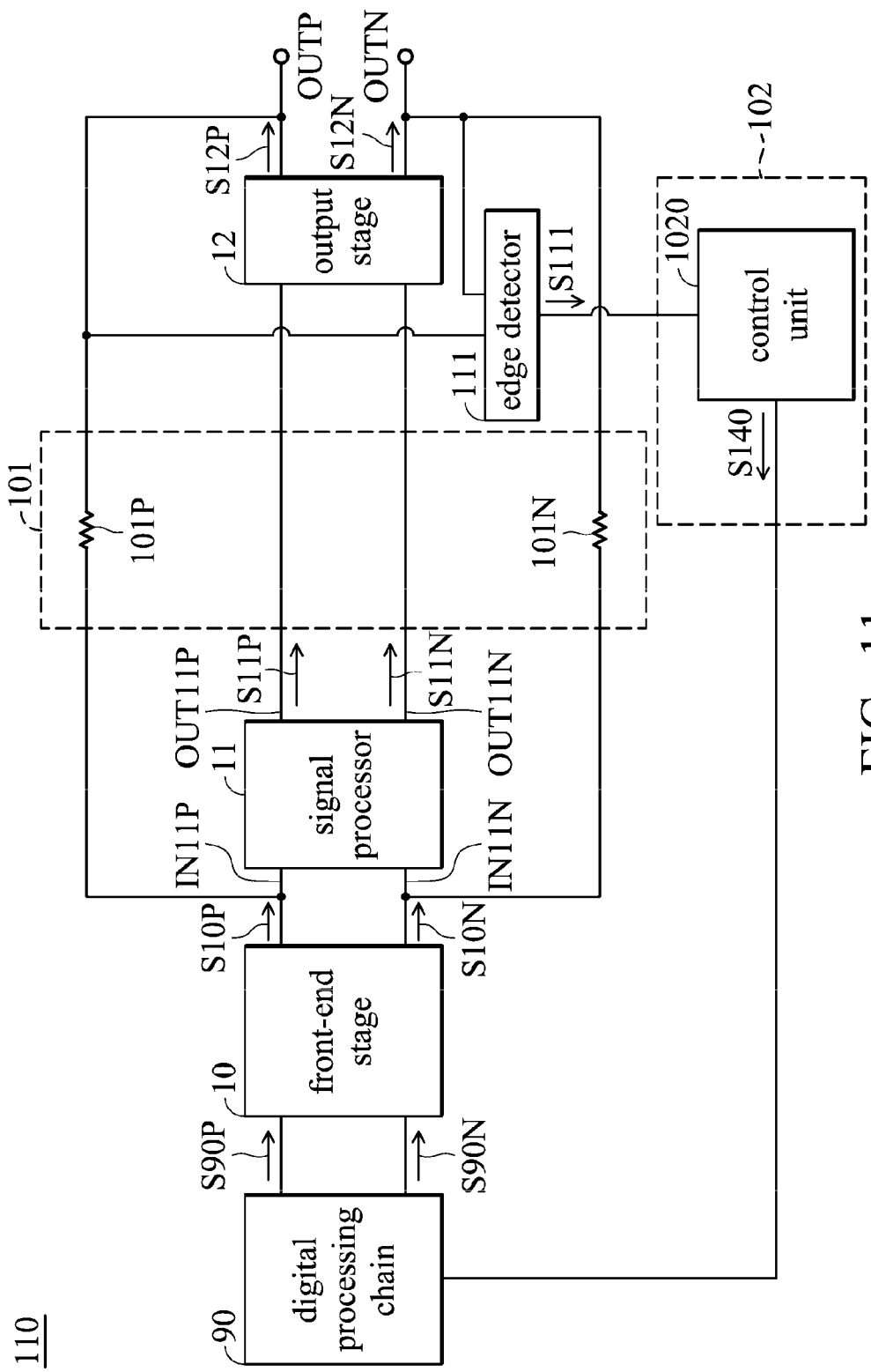
FIG. 11 shows further another exemplary embodiment of an amplifying circuit which performs a voltage offset calibration operation via a digital processing chain before a switching amplifier.

In some other embodiments, as shown in FIG. 11, the amplified signals S12P and S12N serve as output signals for the edge detection operation of the edge detector 13. Referring to FIGS. 10 and 11, the same reference label represents the same element. An amplifying circuit 110 comprises an edge detector 111 which replaces from the edge detector 13 in FIG. 10. The edge detector 111 is configured to detect at least one of a rising edge and a falling edge of each of the amplified signals S12P and S12N to detect the polarity of the voltage offset between the intermediate signals S11P and S11N in the time relationship and generate the detection signal S111 according to the detection result related to the amplified signals S12P and S12N. That is, the edge detector 111 derives the time relationship of the amplified signals S12P and S12N which are generated after the output stage 12 to generate the detection signal S111. The calibration controller 102 receives the detection signal S111 for the voltage offset calibration.

Figure 12:
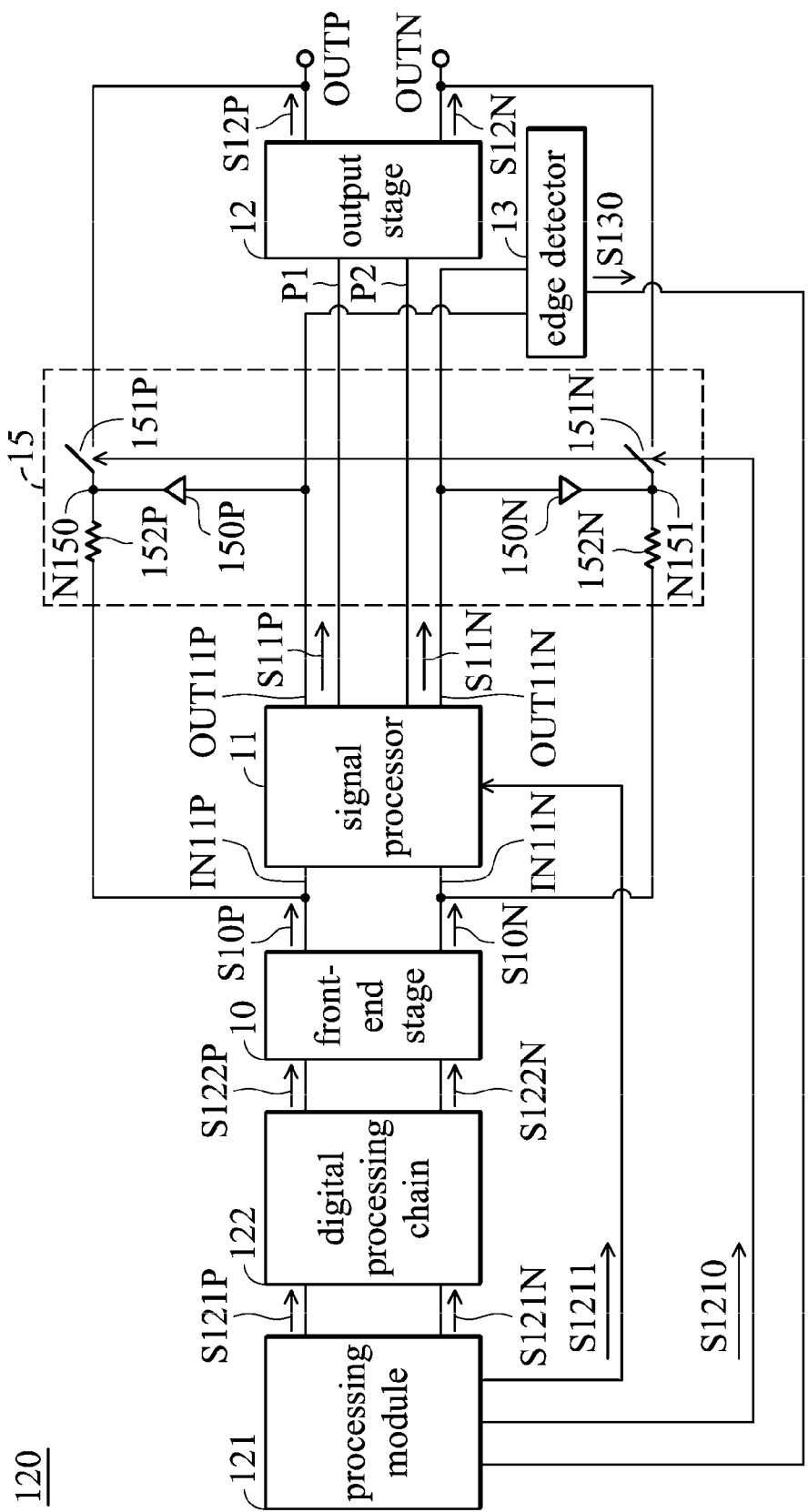
FIG. 12 shows an exemplary embodiment of an amplifying circuit which performs a voltage offset calibration operation via a processing module before a switching amplifier.

FIG. 12 shows another exemplary embodiment of an amplifying circuit. Referring to FIGS. 1 and 12, the same element is represented by the same reference label. The different between the embodiments of FIGS. 1 and 12 is that, in FIG. 12, an amplifying circuit 120 comprises a processing module 121 replacing the calibration controller 14 in FIG. 1 and further comprises a digital processing chain 122. In the embodiment, the signal processor 11, the output stage 12, the edge detector 13, and the feedback unit 15 form a switching amplifier. The processing module 121 generates digital signals S121P and S121N. The digital processing chain 122 receives the digital signals S121P and S121N and generates frond-end signals S122P and S122N according to the digital signals S121P and S121N respectively. The frond-end signals S122P and S1221N are provided to the frond-end stage 10. The front-end stage 10 receives the frond-end signals S122P and S122N and generates the input signals S10P and S10N according to the frond-end signals S122P and S122N respectively. The processing module 121 further receives the detection signal S130 from the edge detector 130 and determines the detected polarity of the voltage offset according to the detection signal S130. During the voltage offset calibration operation (in the calibration mode), the switches 151P and 151N are turned off according to a switching signal S1210 generated by the processing module 121, and, thus, the outer closed loop formed by the signal processor 11, the output stage 12, and the feedback unit 15 is cut off. When the processing module 121 determines that a voltage offset between the intermediate signals S11P and S11N has occurred and that direction of the detected polarity of the voltage offset is positive, the processing module 121 adjusts the digital signals S121P and S121N to change the detected polarity of the voltage offset between the intermediate signals S11P and S11N. In the embodiment, the processing module 121 compensates the voltage offset according to the change of the detected polarity. When the processing module 121 determines that the voltage offset between the intermediate signals S11P and S11N has a positive polarity according to the detection signal S13, the processing module 121 generates the digital signals S121P and S121N between which a voltage offset with a negative polarity has occurred so that the detected polarity of the voltage offset between the intermediate signals S11P and S11N is changed. In contrary, when the processing module 121 determines that the voltage offset between the intermediate signals S11P and S11N has a negative polarity according to the detection signal S13, the processing module 121 generates the digital signals S121P and S121N between which a voltage offset with a positive polarity has occurred so that the detected polarity of the voltage offset between the intermediate signals S11P and S11N us changed. In the embodiment, the processing module 121 is implemented by software or firmware.

In the embodiment, during the voltage offset calibration operation, the processing module 121 generates a control signal S1211. The outer the signal processor 11 stops providing the intermediate signals S11P and S11N to the output stage 12 according to the control signal S1211 from the processing module 121, thereby preventing back-end devices which are configured at back of the output stage 12 from irregular operations.

Figure 13:
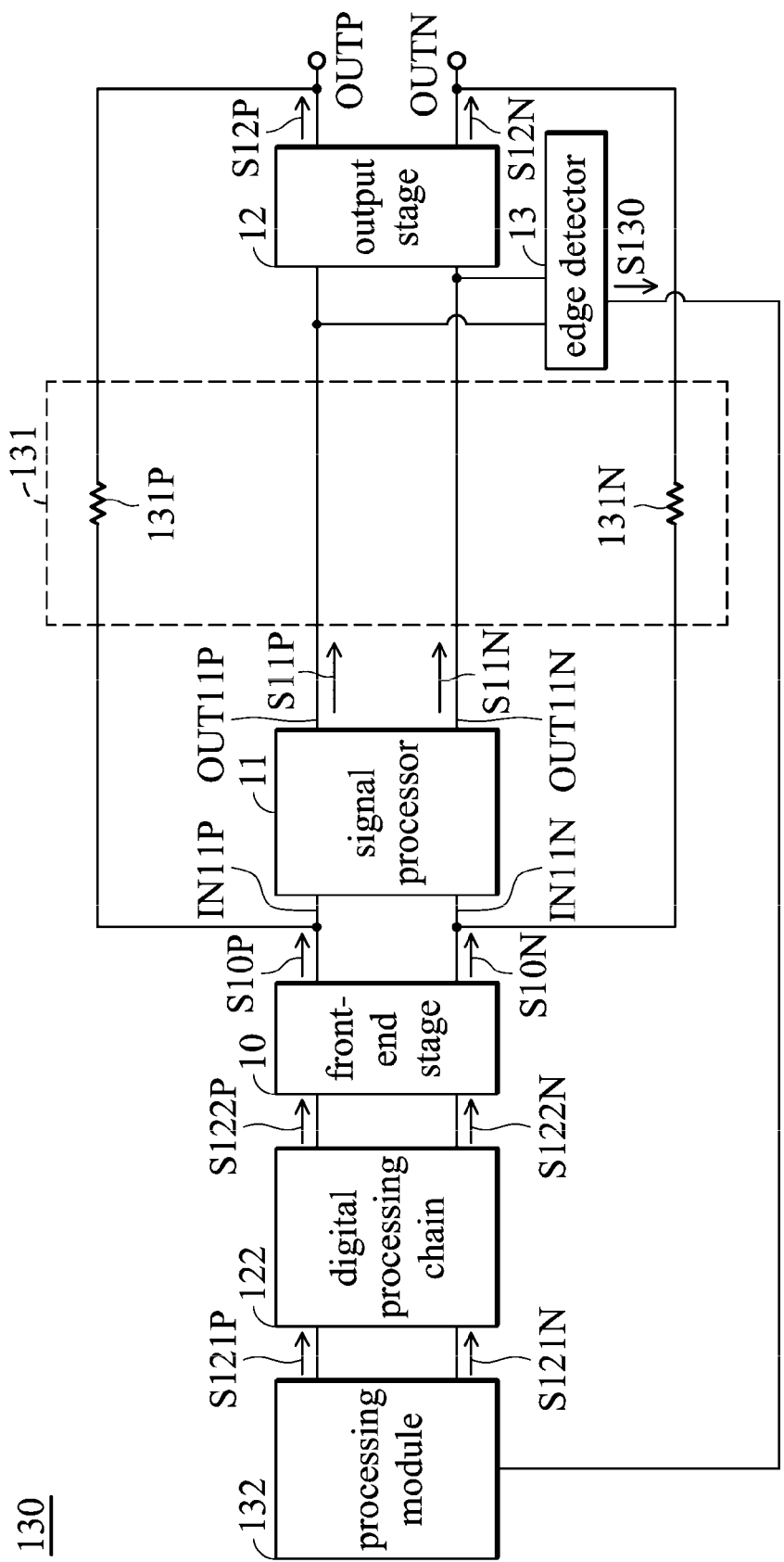
FIG. 13 shows another exemplary embodiment of an amplifying circuit which performs a voltage offset calibration operation via a processing module before a switching amplifier.

In some embodiments, there is no inner closed loop. Referring to FIGS. 12 and 13, the same reference label represents the same element. An amplifying circuit 130 comprises a feedback unit 131 which replacing the feedback unit 15 in FIG. 12. The feedback unit 131 comprises resistors 131P and 131N. The resistor 131P is coupled between the output terminal OUTP of the amplifying circuit 100 and the input terminal IN11P of the signal processor 11, while the resistor 131N is coupled between the output terminal OUTN of the amplifying circuit 100 and the input terminal IN11N of the signal processor 11. Accordingly, there is no inner closed loop formed by the signal processor 11 and the feedback unit 15. In this case, the output stage 12 and the edge detector 13 are coupled to the output terminals OUT11 P and OUT11N of the signal processor 11 to receive the intermediate signals S11 P and S11 N. The signal processor 11, the output stage 12, and the resistors 131P and 131N of the feedback unit 131 form an outer closed loop. Moreover, the amplifying circuit 130 further comprises a processing module 132 replacing the processing module 121 of FIG. 12. The difference between the processing modules 121 and 132 of FIGS. 12 and 13 is that the processing module 132 only generates the digital signals S121 P and S121N without the switching signal S1210 and the control signal S1211. 2. Referring to FIG. 13, since the feedback unit 101 does not comprise the switches S151 P and 151N of FIG. 12, the processing module 132 may not generate the switching signal S1210, and the outer closed loop is not cut off by the processing module 1210 during to the voltage offset calibration operation (in the calibration mode). Moreover, since there is no inner closed loop for voltage offset calibration and the voltage offset calibration operation is performed through the outer closed loop, the signal processor 11 has to provide the intermediate signals S11 P and S11N to the output stage 12. Thus, the processing module 1210 may not generate the control signal S1211 which is configured to control the signal processor 11 to stop transmitting the intermediate signals S11 P and S11 N to the output stage 12.

Figure 14:
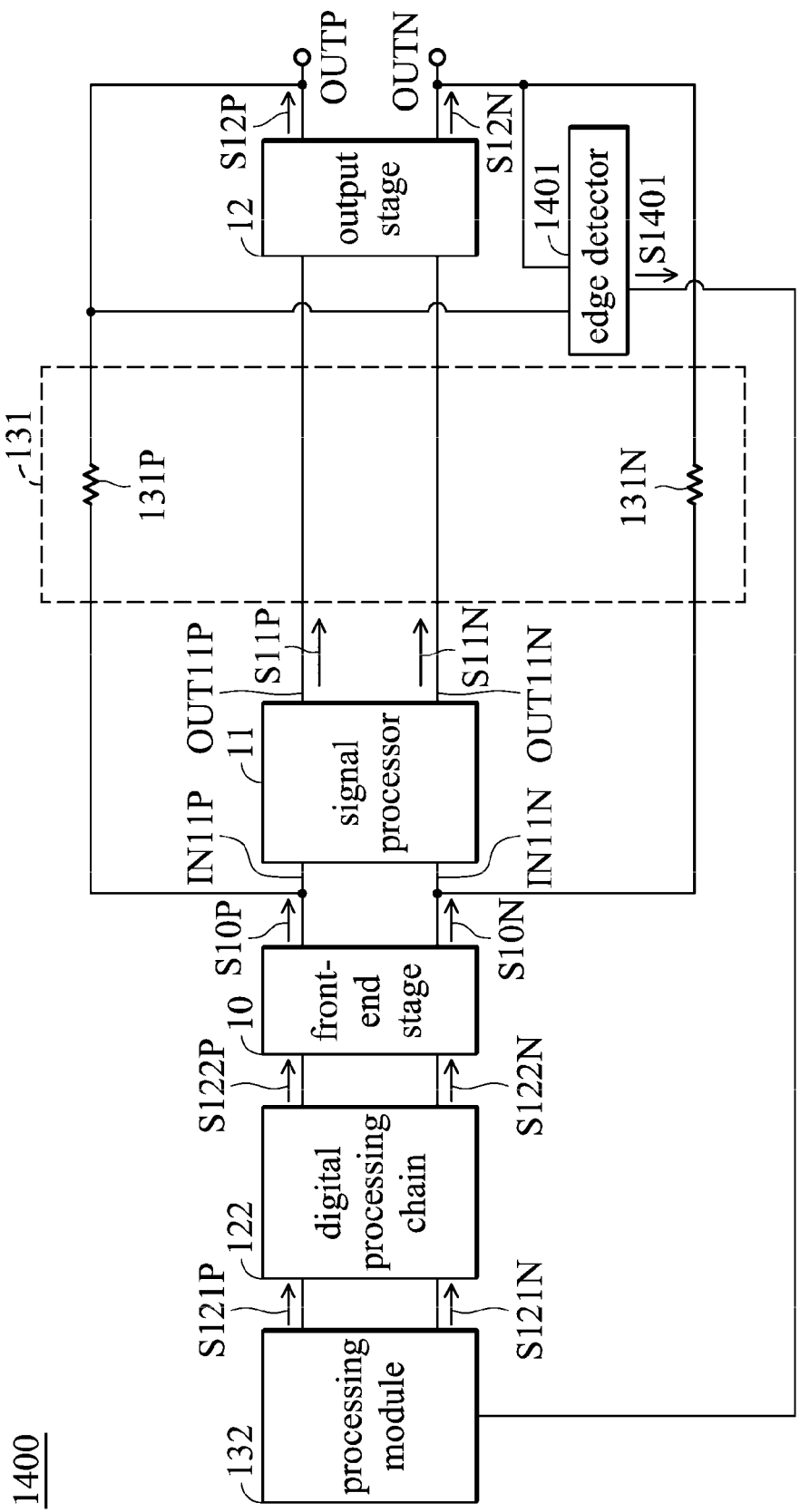
FIG. 14 shows further another exemplary embodiment of an amplifying circuit which performs a voltage offset calibration operation via a processing module before a switching amplifier.

In some other embodiments, as shown in FIG. 14, the amplified signals S12P and S12N serve as output signals for the edge detection operation of the edge detector 13. Referring to FIGS. 12 and 13, the same reference label represents the same element. An amplifying circuit 1400 comprises an edge detector 1401 which replaces from the edge detector 13 in FIG. 12. The edge detector 1401 is configured to detect at least one of a rising edge and a falling edge of each of the amplified signals S12P and S12N to detect the polarity of the voltage offset between the intermediate signals S11P and S11N in the time relationship and generate the detection signal S1401 according to the detection result related to the amplified signals S12P and S12N. That is, the edge detector 1401 derives the time relationship of the amplified signals S12P and S12N which are generated after the output stage 12 to generate the detection signal S1401. The processing module 132 receives the detection signal S1401 for the voltage offset calibration.

In some prior arts, a voltage offset calibration operation is done in an open loop so that accuracy of voltage offset calibration may affected by some back-end circuit elements. According to the above embodiments, the voltage offset calibration operation is done in a closed loop (an inner closed loop or an outer closed loop), thus accuracy of voltage offset calibration by be enhanced. Moreover, the amplitude information of the input signals S10P and S10N is transferred into a time domain to have voltage offset polarity information without the need to break the voltage offset calibration operation in the closed loop.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifying circuit comprising:
a signal processor transforming amplitude information of a first and second input signals into time domain to provide first and second output signals respectively;
an edge detector detecting a polarity of an voltage offset from a timing relationship of the first and second output signals; and
a calibration controller compensating the voltage offset according to a change of the detected polarity.

2. The amplifying circuit as claimed in claim 1, wherein when the detected polarity is changed, the calibration controller ends compensating the voltage offset.

3. The amplifying circuit as claimed in claim 1, wherein the calibration controller reconfigures the amplifying circuit to operation in an inner closed loop in a calibration mode, and the amplifying circuit further comprises a feedback unit coupled to the signal processor, and the signal processor and the feedback unit form the inner closed loop.

4. The amplifying circuit as claimed in claim 1, wherein the calibration controller comprises:
a control unit generating a digital signal according to the detected polarity of the offset voltage; and
a digital-to-analog converter converting the digital signal to a calibration signal in an analog form;
wherein the calibration controller compensates the voltage offset by varying a value of the calibration signal.

5. The amplifying circuit as claimed in claim 4, wherein when detected polarity is changed, the calibration controller stores the digital signal into a register, and the amplifying circuit is shifted to operate in a normal mode.

6. The amplifying circuit as claimed in claim 1, wherein the calibration controller generates a calibration signal according to the detected polarity of the offset voltage, and the amplifying circuit further comprises:
a front-end stage for receiving the calibration signal and generating the first and second input signals;
wherein when the calibration controller compensates the voltage offset in a calibration mode, the calibration controller varies a value of the calibration signal in order to change the detected polarity, and the frond-end stage adjusts the first and second input signals according to the varied calibration signal.

7. The amplifying circuit as claimed in claim 6, wherein the front-end stage comprises a variable gain amplifier which receives the calibration signal, and a transconductance parameter of the variable gain amplifier is adjusted according to the varied calibration signal.

8. The amplifying circuit as claimed in claim 1 further comprising an output stage coupled to the signal processor, wherein the edge detector derives the timing relationship of the first and second output signals before or after the output stage.

9. The amplifying circuit as claimed in claim 1, wherein the calibration controller generates a calibration signal according to the detected polarity of the offset voltage, and when the calibration controller compensates the voltage offset in a calibration mode, the calibration controller varies a value of the calibration signal in order to change the detected polarity, and the signal processor adjusts the first and second output signals according to the varied calibration signal.

10. The amplifying circuit as claimed in claim 1, wherein the calibration controller generates a calibration signal according to the detected polarity of the offset voltage, and the amplifying circuit further comprising:
a digital processing chain for receiving the calibration signal and generating first and second frond-end signals;
a front-end stage for receiving the first and second frond-end signals and generating the first and second input signals according to the first and second frond-end signals respectively; and
wherein when the calibration controller compensates the voltage offset in a calibration mode, the calibration controller varies a value of the calibration signal to change the detected polarity, and the digital processing chain adjusts the first and second front-end signals according to the varied calibration signal.

11. The amplifying circuit as claimed in claim 10, wherein the calibration controller generates the calibration signal in a digital form.

12. An amplifying circuit comprising:
a processing module for generating first and second digital signals;

a digital processing chain for generating first and second frond-end signals according to the first and second digital signals respectively;

a front-end stage for generating first and second input signals in a voltage domain according to the first and second frond-end signals respectively;

a signal processor transforming amplitude information of the first and second input signals into time domain to provide first and second output signals respectively; and an edge detector detecting a polarity of an voltage offset from a timing relationship of the first and second output signals;

wherein the processing module compensates the voltage offset according to a change of the detected polarity.

13. The amplifying circuit as claimed in claim 12, wherein when the detected polarity is changed, the processing module ends compensating the voltage offset.

14. The amplifying circuit as claimed in claim 12, wherein the processing module reconfigures the amplifying circuit to operation in an inner closed loop in a calibration mode, and the amplifying circuit further comprises a feedback unit coupled to the signal processor, and the signal processor and the feedback unit form the inner closed loop.

15. The amplifying circuit as claimed in claim 12 further comprising an output stage coupled to the signal processor, wherein the edge detector drives the timing relationship of the first and second output signals before or after the output stage.

16. A calibration method for an amplifying circuit comprising:

transforming amplitude information of a first and second input signals into time domain to generate first and second output signals respectively;

detecting a polarity of an voltage offset from a timing relationship of the first and second output signals; and compensating the voltage offset according to a change of the detected polarity.

17. The calibration method as claimed in claim 16 further comprising:

ending the step of compensating the voltage offset when the detected polarity is changed.

18. The calibration method as claimed in claim 16, wherein the step of compensating the voltage offset according to a change of the detected polarity is performed in an inner closed loop in the amplifying circuit while operated in a calibration mode.

19. The calibration method as claimed in claim 16, wherein the step of compensating the voltage offset according to a change of the detected polarity comprises:

generating a digital signal according to the detected polarity of the offset voltage;

converting the digital signal to a calibration signal in an analog form; and compensating the voltage offset by varying a value of the calibration signal.

20. The calibration method as claimed in claim 19 further comprising:

when detected polarity is changed, storing the digital signal and shifting the amplifying circuit to be operated in a normal mode.

21. The calibration method as claimed in claim 16, wherein the step of compensating the voltage offset according to a change of the detected polarity comprises:

generating a calibration signal according to the detected polarity of the offset voltage;

in a calibration mode, varying a value of the calibration signal to change the detected polarity; and adjusting the first and second input signals according to the varied calibration signal.

22. The calibration method as claimed in claim 16, wherein the step of compensating the voltage offset according to a change of the detected polarity comprises:

generating a calibration signal according to the detected polarity of the offset voltage;

in a calibration mode, varying a value of the calibration signal to change the detected polarity; and adjusting the first and second output signals according to the varied calibration signal.

23. The calibration method as claimed in claim 16, wherein the step of compensating the voltage offset according to a change of the detected polarity comprises:

generating a calibration signal according to the detected polarity of the offset voltage;

generating first and second frond-end signals according to the calibration signal;

generating the first and second input signals according to the first and second frond-end signals respectively;

in the calibration mode, varying a value of the calibration signal; and adjusting the first and second front-end signals according to the varied calibration signal.

24. The calibration method as claimed in claim 23, wherein the calibration signal is in a digital form.

25. A calibration method for an amplifying circuit comprising:

generating first and second digital signals;

generating first and second frond-end signals according to the first and second digital signals respectively;

generating first and second input signals in a voltage domain according to the first and second frond-end signals respectively;

transforming amplitude information of the first and second input signals into time domain to generate first and second output signals respectively;

detecting a polarity of an voltage offset from a timing relationship of the first and second output signals; and compensating the voltage offset according to a change of the detected polarity.

26. The calibration method as claimed in claim 25 further comprising:

ending the step of compensating the voltage offset when the detected polarity is changed.

27. The calibration method as claimed in claim 25, wherein the step of compensating the voltage offset according to a change of the detected polarity is performed in an inner closed loop in the amplifying circuit while operated in a calibration mode.

* * * * *